(12) United States Patent
Riley et al.

(10) Patent No.: US 10,672,489 B2
(45) Date of Patent: *Jun. 2, 2020

(54) ELECTRONIC DEVICE WITH A FUSE ARRAY MECHANISM

(71) Applicant: Micron Technology, Inc., Boise, ID (US)

(72) Inventors: John E. Riley, McKinney, TX (US); Girish N. Cherussery, Boise, ID (US); Scott E. Smith, Plano, TX (US); Yu-Feng Chen, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/446,848

(22) Filed: Jun. 20, 2019

(65) Prior Publication Data

US 2019/0333594 A1 Oct. 31, 2019

Related U.S. Application Data

(63) Continuation of application No. 15/967,022, filed on Apr. 30, 2018, now Pat. No. 10,373,698.

(51) Int. Cl.
*G11C 7/00* (2006.01)
*G11C 17/16* (2006.01)
*G11C 7/10* (2006.01)
*H01L 23/525* (2006.01)
*G11C 11/34* (2006.01)
*G11C 29/00* (2006.01)
*G11C 17/18* (2006.01)

(52) U.S. Cl.
CPC ............ *G11C 17/16* (2013.01); *G11C 7/1096* (2013.01); *G11C 11/34* (2013.01); *G11C 17/18* (2013.01); *G11C 29/787* (2013.01); *H01L 23/5252* (2013.01); *H01L 23/5256* (2013.01)

(58) Field of Classification Search
CPC ....... G11C 17/18; G11C 17/16; G11C 29/785; G11C 17/165; G11C 29/027
USPC .................................. 365/225.7, 200, 189.05
See application file for complete search history.

(56) References Cited

U.S. PATENT DOCUMENTS

| 6,967,889 | B2 | 11/2005 | Imondi |
| 10,373,698 | B1 * | 8/2019 | Riley ................... G11C 29/787 |
| 2002/0145921 | A1 | 10/2002 | Jones et al. |
| 2008/0316789 | A1 | 12/2008 | Fredeman et al. |
| 2009/0245006 | A1 | 10/2009 | Oikawa |

* cited by examiner

*Primary Examiner* — Son T Dinh
(74) *Attorney, Agent, or Firm* — Perkins Coie LLP

(57) ABSTRACT

An electronic device including: a fuse array including: fuse elements organized along a first direction and a second direction, wherein each fuse element is configured to store information, and a selection circuit configured to provide access to the fuse elements according to positions of the fuse elements along the first direction and the second direction; and a fuse read circuit connected to the fuse array, the fuse read circuit configured to generate a fuse-read output based on reading from one or more of the fuse elements.

20 Claims, 5 Drawing Sheets

ELECTRONIC DEVICE WITH A FUSE ARRAY MECHANISM

CROSS-REFERENCE TO RELATED APPLICATIONS

This application is a continuation of U.S. application Ser. No. 15/967,022, filed Apr. 30, 2018, which is incorporated herein by reference in its entirety.

TECHNICAL FIELD

The disclosed embodiments relate to electronic devices, and, in particular, to semiconductor devices with a fuse array mechanism.

BACKGROUND

Electronic devices, such as semiconductor devices, memory chips, microprocessor chips, and imager chips, can include a set of fuses for storing information. For example, the electronic devices, such as semiconductor dies, can include one or more fuse sets (e.g., groups or networks of fuses or anti-fuses that are programmed to store information). The electronic devices can include the one or more fuse sets in particular locations. Also, the electronic devices can include one or more sets of discrete fuses that are located throughout the device in other designs. The semiconductor die can read the information (e.g., redundancy information, wafer lot number, die lot number, die position on the wafer, voltage trims, timing adjustments, device configuration, etc.) from the fuses and transmit the information (e.g., based on communicating the information in a serial sequence), such as at device startup, initialization, or configuration.

However, fuses and associated read circuits can take up a significant amount of valuable die area. Further, the fuses and associated read circuits can require numerous dedicated control signals, contributing to the complexity of a device implementing large numbers thereof.

DETAILED DESCRIPTION

The technology disclosed herein relates to electronic devices (e.g., semiconductor-level devices, sets of analog circuitry components, etc.), systems with electronic devices, and related methods of operation or manufacture for the electronic devices that include one or more fuse arrays and corresponding read circuit(s). Each fuse array can include a number of fuse cells (e.g., anti-fuses) that are located together within a region within the electronic device. Each fuse array can include an architecture that allows a single read circuit to access any of the fuse cells in the array. In some embodiments, the fuse array can include parallel/redundant sets of fuse cells. Accordingly, the fuse read circuit can include a latch circuit for enabling parallel/simultaneous read for the multiple parallel/redundant fuse cells.

Figure 1:
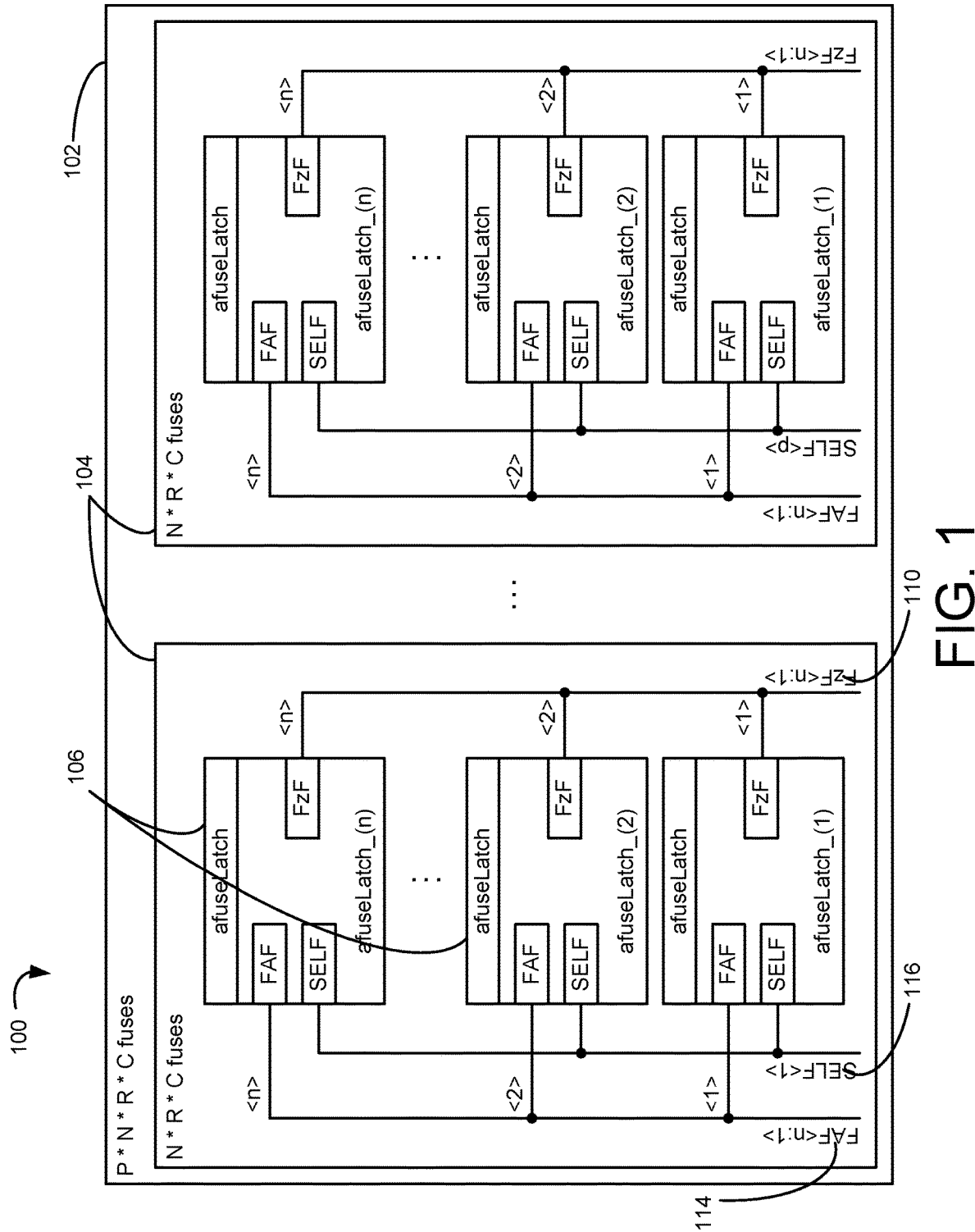
FIG. 1 is a block diagram of an electronic device in accordance with an embodiment of the present technology.

FIG. 1 is a block diagram of an electronic device 100 (e.g., a semiconductor die, such as for a dynamic random-access memory (DRAM)) in accordance with an embodiment of the present technology. The electronic device 100 can include a set of fuses (e.g., anti-fuses, gate-oxide fuses, etc.) configured to store information (e.g., redundancy information, wafer lot number, die lot number, die position on the wafer, voltage trims, timing adjustments, device configuration, etc.). The electronic device 100 can also include a set of readers that are each configured to read the information stored in a grouping/set of fuses.

In some embodiments, the electronic device 100 can include a fuse set 102. The fuse set 102 can include an overall set of fuses for the electronic device 100 or a specific physical portion/area therein. The fuse set 102 can include the fuses grouped according to segment groupings 104, array segments 106, etc. For example, the fuse set 102 can include 'P' number of the segment groupings 104. Further, each of the segment groupings 104 can include 'N' number of the array segments 106. Each of the array segments 106 can include a subgrouping of fuses (e.g., 'R·C' number of fuses) and a read circuit configured to read information stored in the subgrouping of the fuses. The read circuits in each of the array segments 106 can generate a segment output signal 110 ('FzF<n:1>'). For example, within the segment, each read circuit can generate a portion (e.g., a bit) for the segment output signal 110.

The electronic device 100 can select specific groupings of fuses according to a set of selection signals. For example, a grouping selection signal 116 ('SELF') can be used to select one of the segment groupings 104, such as for writing specific fuses therein. Also, a segment address signal 114 ('FAF<n:1>') can be used to select one of the array segments 106.

Figure 2:
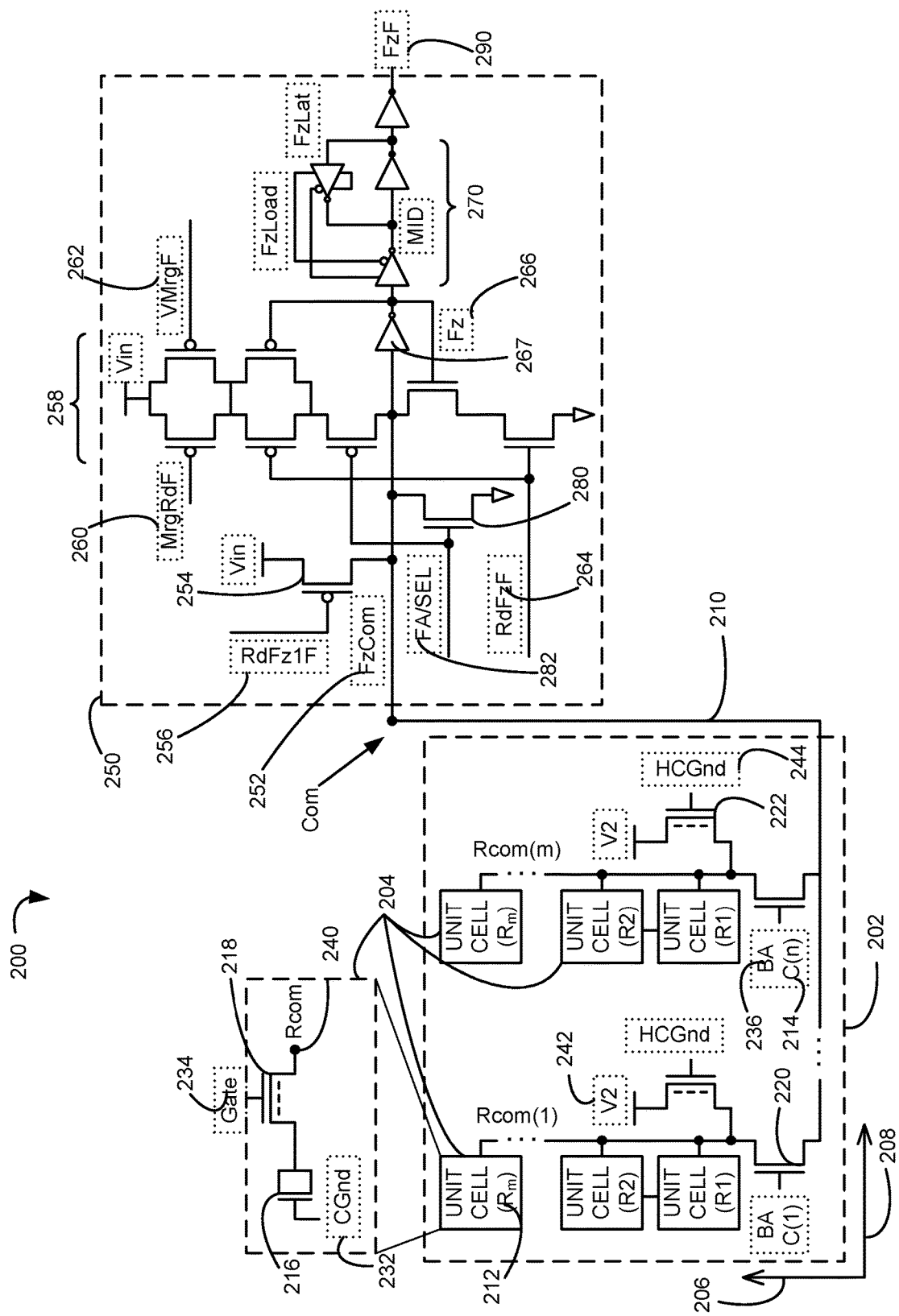
FIG. 2 is a circuit diagram of an electronic device in accordance with an embodiment of the present technology.

FIG. 2 is a circuit diagram of an electronic device 200 (e.g., an instance of the array segment 106 of FIG. 1) in accordance with an embodiment of the present technology. The electronic device 200 can include one or more fuse arrays 202 that each include multiple fuse cells 204 configured to store information according to their programming settings (e.g., for blown or unblown fuse setting). In some embodiments, the fuse arrays 202 can be physically located at a specific portion of the electronic device 200 (e.g., at a central or dedicated portion within the die).

The fuse arrays 202 can each include the fuse cells 204 configured along multiple orthogonal directions for interacting with one or more read circuits and/or for providing simultaneous/parallel access to multiple fuse cells 204. For example, each of the fuse arrays 202 can include the fuse cells 204 organized along a first direction 206 (e.g., a "horizontal" direction, such as for rows), a second direction 208 (e.g., a "vertical" direction, such as for columns), etc. Each of the fuses can be accessed according to a position/location along the multiple directions, such as a position along the first direction 206, a position along the second direction 208, etc.

The fuse arrays 202 can have a number/quantity (e.g., 'm·n') of the fuse cells 204 that correspond to a first size 212 (e.g., a number/quantity of rows, illustrated as 'm'), a second size 214 (e.g., a number/quantity of columns, illustrated as "n"), etc. For example, 256 fuse cells can be arranged in 16 rows and 16 columns. For each fuse array, the fuse cells 204 can be tied to a fuse read node 210 ('Com'), such as an input node for a read circuit.

In some embodiments, each of the fuse cells 204 can include a fuse element 216 (e.g., an anti-fuse or a gate-oxide fuse). The fuse element 216 can include configurable circuitry (e.g. an oxide layer) that can be configured to represent information. For example, the fuse cells 204 can be anti-fuses or gate oxide fuses that provide a relatively high resistance (e.g., associated with an open circuit) when the cell is not programmed or unblown. When programmed or blown, the fuse cell can provide a relatively low resistance (e.g., as associated with an electrical short) to ground or lower potential node, such as through a weakened or damaged oxide layer.

The fuse arrays 202 can also include circuitry configured to select each fuse cell and read the information stored in the fuse element 216 therein, such as for detecting or setting a unblown state or for detecting or setting a blown state. For example, the fuse cells 204 can each include a selection element (e.g., a switch, such as a transistor) that correspond to each of the orthogonal directions, such as a first selection element 218 (e.g., a switch) for selecting along the first direction 206, a second selection element 220 (e.g., a switch) for selecting along the second direction 208, etc.

In some embodiments, the first selection element 218 can be an N-channel MOSFET device (e.g., enhancement mode MOSFET with or without bulk/body connection). Also, the second selection element 220 can be an NMOS transistor. For/in each fuse cell, one terminal of the fuse element 216 can be connected to a conditional ground 232 ('CGND'), and the opposing terminal of the fuse element 216 can be connected to a drain portion of the first selection element 218. A gate portion of the first selection element 218 can be connected to a first selection signal 234 ('Gate'). A source portion of the first selection element 218 can be connected to a drain portion of the second selection element 220. A gate portion of the second selection element 220 can be connected to a second selection signal 236 ('BA'), and A source portion of the second selection element 220 can be connected to the fuse read node 210. In some embodiments, the fuse array 202 can include 256 fuses arranged 16-by-16. Accordingly, the conditional ground 232, the first selection signal 234, the second selection signal 236, etc. can include 16 bits or components ('<16:1>') to control/select the appropriate fuse.

In some embodiments, each fuse read circuit can include a fuse write element 280 (e.g., a switch, such as an N-channel MOSFET device) configured to program/blow the fuse element 216. A drain portion of the fuse write element 280 can be connected to com 210, a gate portion of the fuse write element 280 can be connected to a fuse write select 282 (FA/SEL), and a source portion of the fuse write element 280 can be connected to electrical ground. In programming/blowing the fuse element 216, the fuse write select 282 and the conditional ground 232 can both go high. For reading the state of the fuse element 216, both the fuse write select 282 and the conditional ground 232 can be a lower potential, such as for an electrical ground. In writing/programming/blowing the fuse, the selection circuit (e.g., the first selection element 218 and the second selection element 220) can be used to route the voltage to the selected fuse (e.g., the fuse element 216) to blow or damage the oxide layer therein.

The electronic device 200 can include one or more fuse read circuit(s) 250 connected to the fuse arrays 202. The fuse read circuit 250 can be configured to read the information stored in the fuse cells 204. For example, one fuse read circuit 250 can read the state (e.g., stored information) of one or multiple fuses in the connected fuse array(s). In reading the fuses, the electronic device 200 can connect/select the desired/targeted fuse (e.g., fuse cell or the fuse element 216 therein) using the selection circuit (e.g., based on the first selection signal 234 and the second selection signal 236).

For reading the fuses, the electronic device 200 can precharge the fuse read node 210, and determine the state of the connected fuse based on a voltage level (e.g., a fuse read-level 252 (FzCom)) at the fuse read node 210. The fuse read circuit 250 can include a precharging element 254 (e.g., a switch, such as a PMOS transistor) that operates according to a precharging signal 256 (RdFz1F). The precharging element 254 can be connected to a voltage input (Vin) and the fuse read node 210. The precharging signal 256 can operate the precharging element 254 to precharge the fuse read node 210 using the voltage input. The fuse read circuit 250 can read the fuse setting (e.g., blown/programmed or unblown/not programmed) based on detecting a change in the fuse read-level 252 due to the state of the connected fuse. For example, the fuse read-level 252 can remain relatively steady (e.g., within a threshold range from a predetermined target level) or rise when the connected fuse is not programmed/unblown. Also, the fuse read-level 252 can decrease when the connected fuse is programmed/blown.

The fuse read circuit 250 can further include a input selection circuit 258 configured to select an input power source or the input source level. For example, the input selection circuit 258 can include multiple switches (e.g., PMOS and/or NMOS transistors) configured to select different input voltage used for reading the setting of the connected fuse. The fuse read circuit 250 can use a high-input selection signal 260 (e.g., represented as 'MrgRdF') to select a target voltage level and/or a binary power source for strongly turning on a P channel that can counter act the short through the fuse. The fuse read circuit 250 can use the high-input selection signal 260 to read or test clearly blown fuses (e.g., corresponding to a resistance level close to an electrical short). For weakly blown fuses (e.g., corresponding to a resistance level that is above the electrical short but less than an open circuit level), the fuse read circuit 250 can use a granular-input selection signal 262 to select a lower voltage level and/or an analog variable power source for weakly turning on the P channel and providing a voltage level lower than the target voltage level.

The fuse read circuit 250 can further utilize additional devices/circuits (e.g., NMOS and/or PMOS transistor devices, inverters, or a combination thereof) to read the information stored in the fuse cell. For example, the additional devices/circuits can operate according to a read-lock signal 264 ('RdFzF') for locking or stabilizing the fuse read-level 252 and for generating an intermediate output 266 ('Fz' and corresponding to an intermediate inverter 267) based on the fuse read-level 252. The fuse read circuit 250 can further utilize additional devices/circuits to stabilize or isolate the fuse read-level 252, the intermediate output 266, or a combination thereof from other influences (e.g., latch behavior of the circuit) and generate a fuse-read output 290 (e.g., represented as 'FzF'). The fuse-read output 290 can represent a result generated by the fuse read circuit 250 from reading the information in the connected fuse cell.

In some embodiments, the fuses in the array can have parallel arrangements. For example, two or more fuses can be parallel to each other and represent the same information/bit. The fuse read circuit 250 can be read/sensed simultaneously in parallel. The parallel fuses can be in two different rows along the same column or vice versa.

In some embodiments, the fuse read circuit 250 can include an output latch circuit 270. The output latch circuit 270 can include a set of inverters configured to temporarily hold/store a previously read information. For example, the output latch circuit 270 can hold a voltage level ('FzLat') (e.g., the intermediate output 266 resulting from reading a fuse) while the fuse read circuit 250 reads another fuse, such as for reading the parallel fuses.

Figure 3:
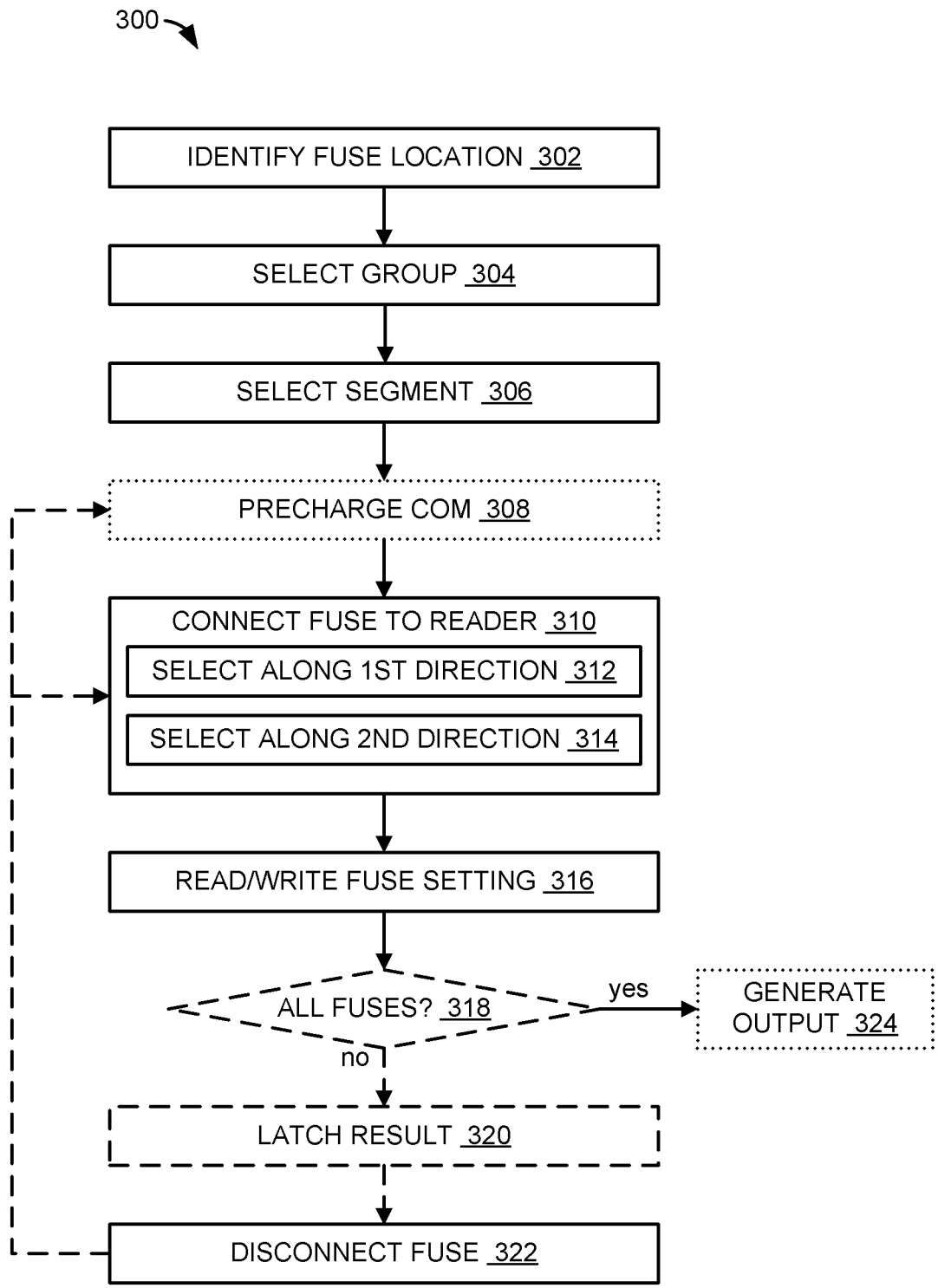
FIG. 3 illustrates an example method of operating an electronic system in accordance with embodiments of the present technology.

FIG. 3 illustrates an example method 300 of operating an electronic system in accordance with embodiments of the present technology. The method 300 can be for operating the electronic device 100 of FIG. 1, the electronic device 200 of FIG. 2, or a combination thereof. The method 300 can include selecting and connecting one or more fuses to a reader.

At block 302, the method 300 can include identifying a fuse location. The electronic device (e.g., the electronic device 100, the electronic device 200, etc.) can identify a location of the fuse. For example, the electronic device can identify one of the fuse cells 204 of FIG. 2 located in one of the array segments 106 of FIG. 1 or the fuse array 202 of FIG. 2, one of the segment groupings 104 of FIG. 1, one of the fuse set 102 of FIG. 1, etc. The electronic device can identify a position/location of the targeted fuse along the first direction 206 of FIG. 2 (e.g., a row number), the second direction 208 of FIG. 2 (e.g., a column number), etc. within the fuse array 202.

For programming the fuse cell, the electronic device can identify a target location for storing corresponding information. For reading the fuse cell, the electronic device can identify a target location that contains the corresponding information. The electronic device can identify the target location according to a firmware, a software, a hardware configuration, a lookup table, or a combination thereof predetermined to access certain fuses/locations according to a sequence or an operation condition.

According to the identified location, the electronic device can select a specific circuit or a grouping/set of fuses. At block 304, the electronic device can select a fuse grouping (e.g., one of the segment groupings 104). For example, the electronic device can generate the grouping selection signal 114 of FIG. 1 corresponding to the location of the targeted fuse. At block 306, the electronic device can select a fuse segment (e.g., one of the array segments 106 or an instance of the fuse array 202, an instance of the fuse read circuit 250 of FIG. 2, or a combination thereof). For example, the electronic device can generate the segment address signal 116 of FIG. 1 corresponding to the location of the targeted fuse.

At block 308, the electronic device can precharge the read node of the selected fuse segment. The electronic device can precharge the fuse read node 210 of FIG. 2 for the reading operation. The electronic device can precharge the fuse read node 210 based on connecting a power source to the fuse read node 210 using/through the input selection circuit 258. In some embodiments, the electronic device can precharge the fuse read node 210 based on selecting and/or routing a precharging input voltage, such as a target voltage level and/or a binary power source using the high-input selection signal 260 of FIG. 2, a lower voltage level and/or an analog variable power source using the granular-input selection signal 262 of FIG. 2, etc. In some embodiments, device 254 can be used to precharge com 210 with RdFz1F 256 prior to reading or writing the fuse.

At block 310, the electronic device can connect the targeted fuse to the reader. The electronic device can connect the targeted fuse element 216 to the corresponding fuse read circuit 250 through the selections circuits (e.g., the first selection element 218 and/or the second selection element 220) within the fuse array 202. The electronic device can provide access to the fuse element 216 through the selection circuits for reading the fuse setting and/or programming the fuse setting. For reading operations, the selection circuits can allow the fuse read circuit 250 to access the targeted fuse. For example, the electronic device can connect the targeted fuse element 216 to the fuse read circuit 250 through the first selection element 218 of FIG. 2 and the second selection element 220 of FIG. 2. For programming operations, the selection circuits can allow the write voltage 232 to access the targeted fuse. For example, the electronic device can connect the fuse element 216 for write by applying the write voltage 232 across the targeted fuse element 216 and the first selection element 218, the second selection element 220, and the fuse write element 280.

In connecting the fuse to the reader, at block 312, the electronic device can select/connect the fuse along the first direction 206. For example, the electronic device (e.g., a control circuitry, such as a processor) can generate the first selection signal 234 of FIG. 2 corresponding to a location of the targeted fuse cell along the first direction 206. The first selection signal 234 can identify/represent a location (e.g., a row position) of the fuse cell along the first direction 206.

The control circuitry can send the first selection signal 234 to the selected fuse array. At the fuse array 202, the first selection signal 234 can be used to operate the first selection element 218. For example, the electronic device can close the switch corresponding to the first selection signal 234 for providing access to the selected fuse cell/fuse element.

At block 314, the electronic device can select/connect the fuse along the second direction 208. For example, such as for reading operations, the electronic device can generate the second selection signal 236 of FIG. 2 corresponding to a location of the targeted fuse cell along the second direction 208. The second selection signal 236 can identify/represent a location (e.g., a column position) of the fuse cell along the second direction 208. Also, such as for writing/programming operations, the electronic device can generate the fuse write select 282 of FIG. 2 corresponding to the targeted fuse. The electronic device can drive the fuse write select 282, as well as the conditional ground 232 of FIG. 2, above a device ground and operate the fuse write element 280 of FIG. 2.

The control circuitry can send the second selection signal 236 to the selected fuse array. At the fuse array 202, the second selection signal 236 can be used to operate the second selection element 220. For example, the electronic device can close the switch corresponding to the second selection signal 236 for providing access to the selected fuse cell/fuse element.

At block 316, the electronic device can perform a targeted operation (e.g., a read operating or a programming operation) with respect to the connected fuse. For example, the electronic device can read the fuse setting based on detecting changes to the fuse read-level 252 of FIG. 2 at the fuse read node 210. The precharged voltage of the fuse read node 210, such as resulting from the process corresponding to block 308, can change according to the status/state of the connected fuse element 216. When the connected fuse element is programmed/blown, the fuse element can provide a path to a lower potential node (e.g., ground) and the voltage level at the fuse read node 210 can decrease from the precharged voltage. When the connected fuse element is not programmed/unblown, the fuse element can isolate the fuse read node 210 from a lower potential node. Accordingly, the fuse read-level 252 can remain at the precharged voltage level or increase. After a predetermined time period intended for the fuse read-level 252 to settle according to the fuse setting, the electronic device can use the fuse read circuit 250 (e.g., the intermediate inverter 267 of FIG. 2, the output inverter/comparator, etc.) to determine the fuse read-level 252 and/or the information (e.g., bit value) corresponding thereto.

Also, the electronic device can write/program the fuse setting based on damaging an oxide layer/component within the fuse element 216 of the selected fuse cell. Based on operating the fuse write element 280 according to the second signal (e.g., the fuse write select 282), as represented in block 314, the electronic device can use the write voltage 232 of FIG. 2 to program/blow the oxide layer of the connected fuse element.

In some embodiments, the electronic device can read/program multiple fuses corresponding to a single data unit. For example, the electronic device can read/program a set of fuses for redundant/parallel information (e.g., a bit) for reducing reading/programming errors. Also, the electronic device can read/program a set of fuses for a single data unit, such as for a sequence of bits representing redundancy information, wafer lot number, die lot number, die position on the wafer, wafer, voltage trims, timing adjustments, device configuration, etc.

For processing the set of fuses, the electronic device can determine whether all of the fuses for the selected set have been processed (e.g., read or programmed), such as represented at decision block 318. The electronic device can compare the fuse location to a fuse sequence, an operation/iteration count to a threshold, etc. to determine whether all of the fuses have been processed.

For write operations, the electronic device can disconnect the connected fuse, such as represented at block 322, when not all of the fuses have been programmed. For example, the electronic device can remove/cancel/return the first selection signal 234, the fuse write select 282, etc. and open the first selection element 218, the write selection element 280, etc. The electronic device can iteratively connect and write the sequence of fuses, such as represented by a feedback loop from block 322 to block 310, until all of the fuses have been programmed. The method 300 can end the iterative write/programming operation(s) when all of the fuses in the set have been programmed.

In some embodiments, for read operations, the electronic device can latch or temporarily store the read information as represented at block 320. The electronic device can latch or temporarily store the intermediate output 266 resulting from the read/connected fuse. The electronic device can latch the information using the output latch circuit 270 of FIG. 2. At block 322, the electronic device can disconnect the fuse from the read circuit. For example, the electronic device can remove/cancel the first selection signal 234, the second selection signal 236, etc. and open the first selection element 218, the second selection element 220, etc.

When all of the fuses in the set have been read, the electronic device can generate a read output as represented at block 324. For example, the fuse read circuit 250 can generate the fuse-read output 290 of FIG. 2, the segment output signal 110 of FIG. 1, etc. The fuse read circuit 250 can generate the output according to the latched output. For example, the fuse read circuit 250 can generate the output according to the redundant information.

The arrangement of the fuses along multiple orthogonal directions, configurations, connections, etc. and corresponding elements switches can allow the electronic device to blow/program and/or read multiple fuses in parallel with a single read circuit. Accordingly, the fuse arrangement and the cell-internal selection circuits can reduce a variability in fuse read results based on reducing the total number of fuse read circuits and increasing a number of fuses assigned to each read circuit. Further, the fuse arrangement and the cell-internal selection circuits can improve the manufacturability of the electronic device by physically locating the fuses in a compact location/area with a repeatable pattern. Also, the fuse arrangement and the cell-internal selection circuits can allow the fuses to be located in any area/location without being restricted to a related circuit requiring the information from the fuse. Accordingly, the fuses can be located away from tight layout area.

Figure 4:
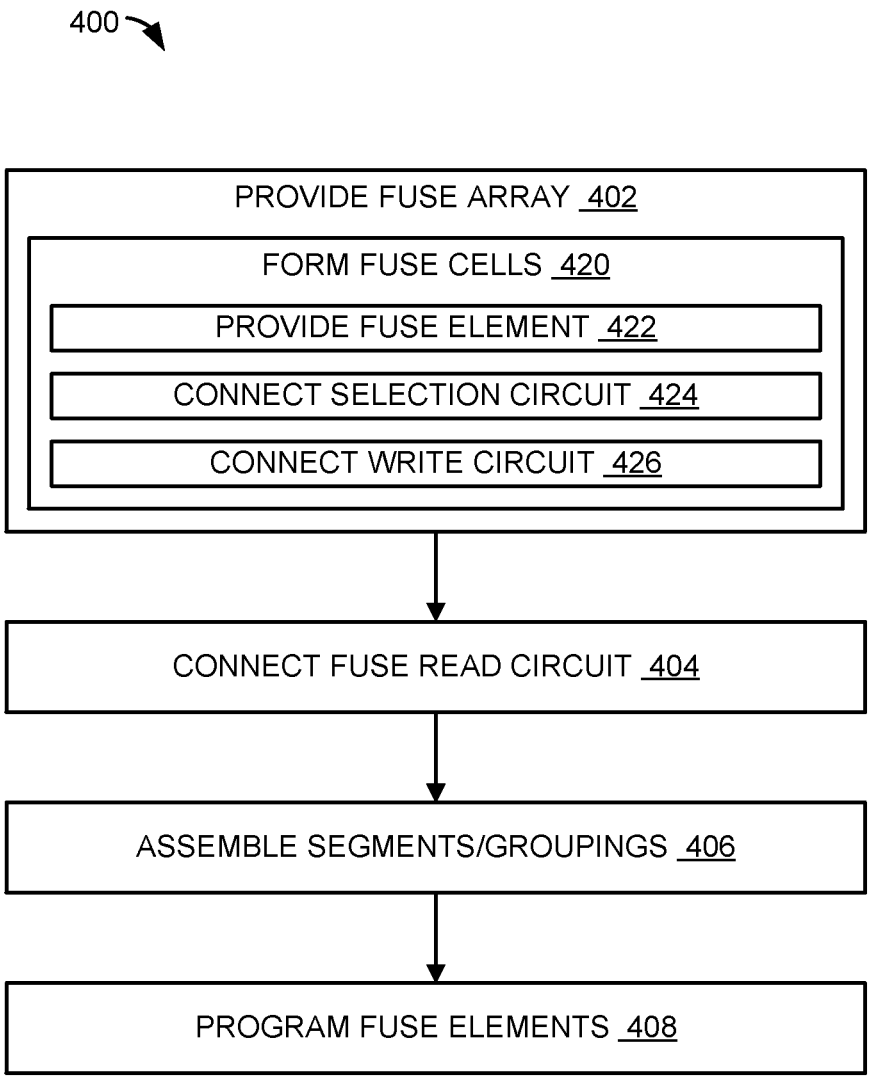
FIG. 4 illustrates an example method of manufacturing an electronic device in accordance with embodiments of the present technology.

FIG. 4 illustrates an example method 400 of manufacturing an electronic device in accordance with embodiments of the present technology. The method 400 can be for manufacturing the electronic device 100 of FIG. 1, the electronic device 200 of FIG. 2, or a combination thereof.

At block 402, the method 400 can include providing a fuse array (e.g., the fuse array 202 of FIG. 2). Providing the fuse array can include providing the fuse array including the fuse cells 204 of FIG. 2 arranged/organized along the first direction 206 of FIG. 2, the second direction 208 of FIG. 2, etc. In some embodiments, providing the fuse array can include forming the fuse array 202 and/or the fuse cells 204 arranged/organized along the first direction 206, the second direction 208, etc.

For example, forming the fuse array can include forming the fuse cells 204, as represented in block 420. The fuse array 202, the fuse cells 204, and/or components therein can be formed according to semiconductor-level or wafer-level processes used to form the corresponding circuits.

Forming the fuse cells 204 can include providing/forming the fuse element 216 of FIG. 2 configured to store information, as represented in block 422. In some embodiments, forming the fuse element 216 can include forming a dielectric/oxide layer and forming gates/terminals coupled to the dielectric/oxide layer. One of the terminals can be connected to the conditional ground 232 of FIG. 2 and the opposing terminal (e.g., across the oxide layer) can be connected to the selection circuits.

Also, as represented in block 424, forming the fuse cells 204 can include forming the selection circuit(s), such as the first selection element 218 of FIG. 2, the second selection element 220 of FIG. 2, etc., and connecting them to the fuse element 216. The selection circuit(s) can be configured to provide access to the fuse element 216 according to a position of the fuse cell along the first direction 206 and the second direction 208. The first selection element 218 can be configured to provide access to the fuse element 216 according to a position of the fuse cell element along the first direction 206. The second selection element 220 can be configured to provide access to the fuse element 216 according to a position of the fuse cell element along the second direction 208.

Further, as represented in block 424, to safe guard against unintentional blows during write, the device 222, voltage 242, and signal HCGnd 244 can be used to weakly hold Rcom 240 high. Accordingly, the unselected fuses can be biased through the first selection element 218 to avoid unintentional write voltage conditions across the unselected fuse 216.

In some embodiments, the method 400 can include providing/forming the fuse read circuit 250. For example, the fuse read circuit 250 can be formed using semiconductor-level or wafer-level processes, similarly as discussed above. The fuse read circuit 250 can be configured to generate the fuse-read output 290 of FIG. 2 and/or the segment output signal 110 of FIG. 1 based on reading from one or more of the fuse cells 204. At block 404, the fuse array 202 can be connected to the fuse read circuit 250. For example, the fuse read circuit 250 can be connected to the fuse read node 210, which can be connected to all of the fuse cells 204 (e.g., the second selection element 220 therein) in the fuse array 202.

At block 406, multiple instances of the fuse arrays (e.g., array segments 106 of FIG. 1) can be grouped/connected. For example, multiple fuse arrays can be grouped to form the segment groupings 104 of FIG. 1. Also, multiple segment groupings 104 can be grouped to form an instance of the fuse set 102 of FIG. 1. Further, the different groupings can be wired/connected according to selection signals and/or corresponding circuits. For example, the segment groupings 104 can include circuits/configurations for selecting the fuse array 202 using the segment address signal 116 of FIG. 1. Also, the fuse set 102 can include circuits/configurations for selecting the segment groupings 104 using the grouping selection signal 114 of FIG. 1 using the grouping selection signal 114 of FIG. 1.

At block 408, the fuse arrays can be programmed to store content information. For example, instances of the fuse elements can be programmed to represent data, such as a bit value. In some embodiments, the fuse elements can be programmed using the method 300 of FIG. 3 as discussed above. For example, the fuse element can be accessed using the first selection element 218, the fuse write element 280, etc., based on increasing a voltage level of the conditional ground 232, the fuse write select 282, etc. Based on the access, the conditional ground voltage 232 can be used to damage the oxide layer of the selected fuse element, thereby creating a path to a lower potential node.

Figure 5:
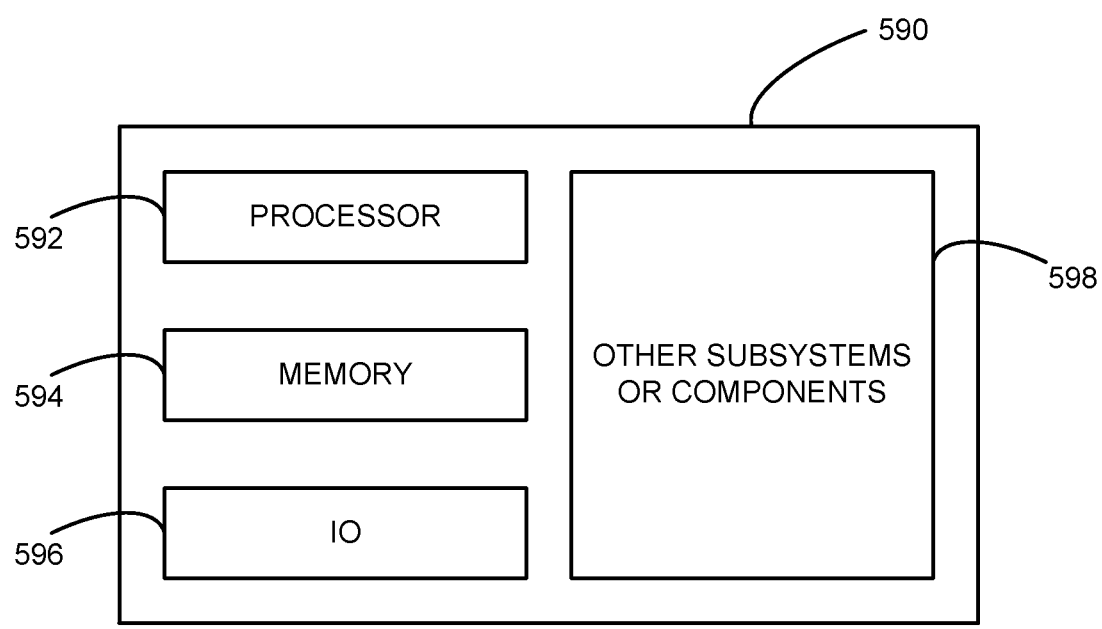
FIG. 5 is a schematic view of a system that includes an electronic device in accordance with embodiments of the present technology.

FIG. 5 is a schematic view of a system that includes an electronic device in accordance with embodiments of the present technology. Any one of the semiconductor devices having the features described above with reference to FIGS. 1-4 can be incorporated into any of a myriad of larger and/or more complex systems, a representative example of which is system 590 shown schematically in FIG. 5. The system 590 can include a processor 592, a memory 594 (e.g., SRAM, DRAM, flash, and/or other memory devices), input/output devices 596, and/or other subsystems or components 598. The semiconductor assemblies, devices, and device packages described above with reference to FIGS. 1-4 can be included in any of the elements shown in FIG. 5. The resulting system 590 can be configured to perform any of a wide variety of suitable computing, processing, storage, sensing, imaging, and/or other functions. Accordingly, representative examples of the system 590 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 590 include lights, cameras, vehicles, etc. With regard to these and other examples, the system 590 can be housed in a single unit or distributed over multiple interconnected units, e.g., through a communication network. The components of the system 590 can accordingly include local and/or remote memory storage devices and any of a wide variety of suitable computer-readable media.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-5.

From the foregoing, it will be appreciated that specific embodiments of the present technology have been described herein for purposes of illustration, but that various modifications may be made without deviating from the disclosure. In addition, certain aspects of the disclosure described in the context of particular embodiments may be combined or eliminated in other embodiments. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

We claim:

1. An electronic device, comprising:
a fuse array including:
fuse elements organized along a first direction and a second direction, wherein each fuse element is configured to store information, and
a selection circuit configured to provide access to the fuse elements according to positions of the fuse elements along the first direction and the second direction,
wherein:
the fuse array includes at least one redundant set of the fuse elements; and
a fuse read circuit connected to the fuse array, the fuse read circuit configured to generate a fuse-read output based on reading from the redundant set of the fuse elements, wherein the fuse-read output represents a single data unit that corresponds to the redundant set of the fuse elements.

2. The electronic device of claim 1, wherein the selection circuit includes:
a first selection element configured to provide access to the fuse element according to a position of the fuse element along the first direction; and
a second selection element configured to provide access to the fuse element according to a position of the fuse element along the second direction.

3. The electronic device of claim 2, wherein the first selection element is a switch that includes:
a first portion directly connected to the fuse element;
a control portion configured to receive a first selection signal for operating the N-channel MOSFET device; and
a second portion directly connected to the second selection element.

4. The electronic device of claim 3, wherein the switch is an N-channel MOSFET device, wherein:
the first portion is a drain portion directly connected to the fuse element;
the control portion is a gate portion configured to receive a first selection signal for operating the N-channel MOSFET device; and
the second portion is a source portion directly connected to the second selection element.

5. The electronic device of claim 2, wherein the second selection element is a switch that includes:
a first portion directly connected to the first selection element;
a control portion configured to receive a second selection signal for operating the NMOS device; and
a second portion directly connected to the fuse read circuit.

6. The electronic device of claim 5, wherein the switch is an NMOS device, wherein:
the first portion is a drain portion directly connected to the first selection element;
the control portion is a gate portion configured to receive a second selection signal for operating the NMOS device; and
the second portion is a source portion directly connected to the fuse read circuit.

7. The electronic device of claim 1, further comprising a fuse write element coupled to the fuse element and the selection circuit, the fuse write element configured to write/program the fuse element.

8. The electronic device of claim 1, wherein the fuse element is a transistor device including:
a first portion directly connected to electrical ground;
a gate portion configured to receive a fuse write select; and
a second portion directly connected to the selection circuit,
wherein:
the fuse element is directly connected to the selection circuit and directly connected to a conditional ground opposite the selection circuit, wherein the conditional ground and the fuse write select is configured to driven above a device ground to write/program the fuse element.

9. The electronic device of claim 1, wherein the redundant set of the fuse elements includes a first fuse element configured to store information and a second fuse element configured to store the same information.

10. The electronic device of claim 1, wherein the fuse read circuit includes an output latch circuit configured to store a latched output resulting from reading a first fuse element while reading a second fuse element, wherein the first and send elements comprise the redundant set.

11. The electronic device of claim 1, further comprising one or more fuse sets that each include multiple arrays and multiple read circuits, wherein each of the arrays are coupled to at least one read circuit.

12. The electronic device of claim 11, wherein the multiple arrays and the multiple read circuits are grouped into segment groupings within each of the fuse sets.

13. The electronic device of claim 12, wherein each fuse set is configured to select a particular array based on a grouping selection signal and a segment address signal, wherein the grouping selection signal is for selecting one of the segment groupings within the fuse set and the segment address signal is for selecting one of the arrays within the selected segment grouping.

14. The electronic device of claim 1, wherein:
the fuse array includes the fuse elements coupled together at a fuse read node; and
the fuse read circuit is connected to the fuse read node.

15. The electronic device of claim 1, wherein the fuse element includes an anti-fuse including an oxide layer for representing an unblown setting or a blown setting, wherein the unblown setting corresponds to a first resistance level associated with an electrical open and the blown setting corresponds to a second resistance level associated with an electrical short, the second resistance level lower than the first resistance level.

16. A method of operating an electronic device including a fuse array including multiple fuse elements, comprising:
generating a first selection signal for identifying a fuse element along a first direction;
generating a second selection signal for identifying the fuse element along a second direction;
providing access to the fuse cell based on:
operating the first selection element according to the first selection signal, and
operating the second selection element according to the second selection signal; and
based on accessing two or more fuse elements comprising a redundant set, generating a fuse-read output that represents a single data unit corresponding to the redundant set of the fuse elements.

17. The method of claim 16, wherein providing access to the fuse cell includes connecting a fuse element in the fuse cell to a fuse read circuit through the first selection element and the second selection element.

18. The method of claim 16, wherein:
providing access to the fuse cell includes connecting a fuse element in the fuse cell to a write voltage through the first selection element, the second selection element, and a fuse write element; and
further comprising:
driving a conditional ground above a device ground to program the connected fuse element, wherein the conditional ground is connected to the fuse element opposite the first selection element.

19. A method of manufacturing an electronic device, comprising:
providing a fuse array including:
fuse elements organized along a first direction and a second direction, wherein each fuse element is configured to store information, and
a selection circuit configured to provide access to the fuse elements according to positions of the fuse elements along the first direction and the second direction,
wherein:
the fuse array includes at least one redundant set of the fuse elements; and
connecting a fuse read circuit to the fuse array, the fuse read circuit configured to generate a fuse-read output based on reading from one or more of the fuse cells.

20. The method of claim 19, wherein providing the fuse array includes:
providing the selection circuit connected to a fuse write element; and
connecting the selection circuit to the fuse element, wherein the selection circuit includes:
a first selection element configured to provide access to the fuse element according to a position of the fuse cell element along the first direction, and a second selection element configured to provide access to the fuse element according to a position of the fuse cell element along the second direction.

\* \* \* \* \*